United States Patent [19]

Westermeier

[11] Patent Number: 4,592,059
[45] Date of Patent: May 27, 1986

[54] LASER DIODE WITH SIMPLIFIED ADJUSTMENT DURING ASSEMBLY

[75] Inventor: Heinz Westermeier, Neubiberg, Fed. Rep. of Germany

[73] Assignee: Siemens Aktiengesellschaft, Berlin & Munich, Fed. Rep. of Germany

[21] Appl. No.: 640,161

[22] Filed: Aug. 13, 1984

[30] Foreign Application Priority Data

Aug. 23, 1983 [DE] Fed. Rep. of Germany ....... 3330392

[51] Int. Cl.⁴ .............................................. H01S 3/045
[52] U.S. Cl. ......................................... 372/36; 357/81; 372/46
[58] Field of Search ................ 372/36, 44, 46; 357/81

[56] References Cited

U.S. PATENT DOCUMENTS 4,161,701 7/1979 Takeda et al. ........................ 372/36
4,411,057 10/1983 Duda et al. ............................ 372/36

FOREIGN PATENT DOCUMENTS 0056984 4/1982 Japan ..................................... 372/36

OTHER PUBLICATIONS

G. Hutchins, "Copper Mesa Heat Sink for Heterojunction Lasers", *IBM Technical Disclosure Bulletin*, vol. 17, No. 1, Jun. 1974, p. 282.

O. Nakada et al., "Continuous Operation Over 2500 h of Double Heterostructure Laser Diodes With Output Powers More Than 80 mW", *Japan J. Appl. Phys.*, vol. 13, No. 9, 1974, pp. 1485–1486.

"Capillary Bonded Components For Injection Laser Transmitter Modules", Comerford et al., Electronics Letters, Jul. 1982, vol. 18, No. 14, pp. 629–631.

*Primary Examiner*—James W. Davie
*Attorney, Agent, or Firm*—Hill, Van Santen, Steadman & Simpson

[57] ABSTRACT

A laser diode which can be easily adjusted during assembly of the diode on a heat sink is mounted over a groove in the heat sink which is free of solder. The groove permits adjustment of a light-transmitting glass fiber relative to the radition-emitting zone of the laser diode. The groove and the laser diode in the form of a chip having a strip-shaped radiation emitting zone are aligned so as to be parallel. Because mechanical connection between the body of the heat sink and the chip exists only outside of the groove, mechanical stresses which would otherwise act upon the radiation-emitting zone are relieved.

5 Claims, 2 Drawing Figures

LASER DIODE WITH SIMPLIFIED ADJUSTMENT DURING ASSEMBLY

BACKGROUND OF THE INVENTION

1. Field of the Invention

The present invention relates to laser diodes, and in particular to a laser diode mounted on a heat sink having a strip-shaped radiation-emitting zone.

2. Description of the Prior Art

Laser diodes are known in the art (Electronic Letters Vol. 18 (1982) pp. 629, FIG. 2) which are coupled to a glass fiber or light wave guide serving for radiation transmission. Such conventional laser diodes are soldered onto a heat sink. For this purpose, conventional heat sinks generally have a V-shaped groove above which the laser diode, in the form of a semiconductor chip, is situated. The V-shaped groove functions to accept the solder, and is filled to its upper level with solder. As seen by the chip, the body of the heat sink and the solder disposed in the groove form a substantially smooth surface on which the chip is located. This groove, which typically has a width of approximately 75 micrometers, and the laser diode chip situated thereabove are aligned relative to each other such that the groove and the radiation-emitting, or laser-active, zone of the chip are above one another. The surface of the body of the heat sink has further grooves running at right angles to this groove, which are provided as a means for solder flow.

As is known, a laser diode emits laser radiation through an end face of a chip having a strip-shaped laser-active zone. For employment of the laser diode in combination with a light conducting fiber, the chip and the fiber are aligned relative to each other such that the end face of the chip and the end face of the fiber are opposite each other up to a spacing of approximately 20 micrometers, with the center axis of the fiber being adjusted to the radiation-generating center of the strip-shaped laser-active zone of the chip.

One possibility for mounting the laser diode (that is, the chip in which the laser diode is realized) on the heat sink is known as an upside-down arrangement. This means that the laser-active zone is situated in the semiconductor chip very close to the surface of the chip which is adjacent to the heat sink, for example, at a distance of only two through five micrometers. The laser-active zone is generally disposed in one of a plurality of epitaxial layers which are applied to a semiconductor body, the semiconductor body being significantly thicker in comparison to these layers. The position of the laser diode must thereby be adjusted within a precision range of ±2 micrometers so as not to generate any disruptive side effects in the beam propagation. Achieving such precise adjustment is a problem in the assembly of such laser diodes.

SUMMARY OF THE INVENTION

It is an object of the present invention to provide a laser diode which can be easily adjusted on a heat sink during assembly so as to achieve substantially unimpeded emission of the laser radiation through the end face of the chip in which the laser diode is realized.

It is a further object of the present invention to provide such a laser diode having no disadvantageous effects relating to heat dissipation and/or power consumption as a result of the simplified assembly.

The above objects are inventively achieved in a laser diode having a strip-shaped laser-active zone at an end face thereof which is mounted upside-down on a heat sink with a solder layer for connecting the chip and the heat sink disposed between a contact layer of the diode and the heat sink, the heat sink having a groove therein in the region of the laser-active zone, the width and depth of the groove being dimensioned such that the laser radiation emerging from the chip does not impinge upon the material of the heat sink, even when the end face of the chip is recessed up to approximately 20 micrometers relative to a front face of the heat sink.

In conventional mounting arrangements for laser diodes with a heat sink, generally the end face of the chip at which the laser radiation exists and the leading face of the body of the heat sink adjacent to this end face of the chip form a single continuous plane. Accordingly, the chip is adjusted on the body of the heat sink such that the upper edge of the chip and the upper edge of the body of the heat sink adjacent thereto are coincident, the chip and the heat sink forming a planar front. The end face of a light conducting glass fiber is aligned opposite this planar front.

The laser diode disclosed herein permits the end face of the chip to be recessed back from the leading edge of the heat sink body by approximately 10 through 20 micrometers without difficulty. Such recessing of the end face of the chip in no way impedes emission of the laser radiation exiting through this end face of the chip because of the presence of the groove in the heat sink which is not filled with solder as in conventional constructions.

The same result can be achieved by placing the end face of the chip on the body of the heat sink such that the end face projects beyond the leading edge of the heat sink, however, such a construction is disadvantageous in view of the mechanical coupling of the glass fiber and in order to obtain reliable heat dissipation from regions of the laser-active zone which are disposed close to the end face.

The groove in the heat sink in accordance with the principles of the present invention is not filled with solder, thereby permitting adjustment of the end of the glass fiber relative to the laser-active zone given recess of the end face of the chip laser diode relative to the leading face of the body of the heat sink. The shape and dimensions of the groove are matched to the diameter of the glass fiber, however, the width of the groove cannot be selected too large in order to maintain favorable heat dissipation from the chip.

In accordance with the principles of the present invention the groove in the heat sink is present not only in the region of the end face of the chip from which the laser radiation emerges, but also the groove extends under the entire chip containing the diode. The groove and the chip with the strip-shaped laser-active zone therein are thus aligned relative to each other such that the groove and the zone are parallel to each other. It is preferable to dimension the width of the groove such that the width is equal to the width of the wave-conducting region of the laser radiation generated in the strip-shaped laser-active zone. This permits uniform support of the semiconductor chip in the region of the laser-active zone and the adjacent wave-conducting region, because mechanical connection between the body of the heat sink and the chip exists only outside of the groove.

DESCRIPTION OF THE PREFERRED EMBODIMENTS

Figure 1:
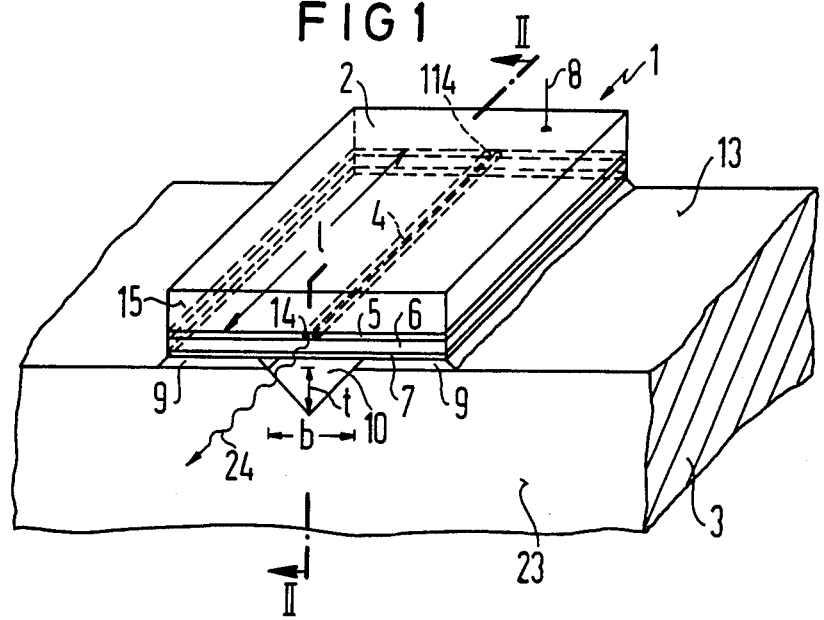
FIG. 1 is a perspective view of a laser diode mounted on a heat sink in accordance with the principles of the present invention.

A laser diode assembled on a heat sink in accordance with the principles of the present invention is generally referenced at 1 in FIG. 1. The laser diode is realized in a semiconductor chip 2 which exhibits a strip-shaped laser-active zone 4 from which laser radiation emerges. The body of the heat sink is referenced at 3. The strip-shaped laser-active zone 4 extends along the entire length l of the chip 2, and is disposed in a layer 5 which is epitaxially applied to the substrate body. A further epitaxially applied layer is referenced at 6. The chip 2 is mounted "upside-down," that is, the zone 4 is disposed relatively close to the surface 13 of the heat sink 3.

As viewed in FIG. 1, a front end face of the chip 2 is referenced at 15, and a radiation exit port 14 therein is referenced at 14, an identical port 114 being disposed at an opposite end face of the chip 2. The end face 15 is generally perpendicular to the upper surface 13 of the heat sink 3.

A metal contact layer 7 functions as a power lead electrode for the laser-active zone 4. The metal contact layer 7 may consist, for example, of silver or platinum, but preferably consists of gold. A substrate contact 8 funcitons as the second power lead terminal for the diode.

In accordance with known manufacturing techniques for laser diodes, the current flux is concentrated in the region of the zone 4.

A solder layer 9 provides a solid mechanical connection between the metal contact layer 7 (and thus the chip 2) and the body of the heat sink 3. The solder layer 9 may consist, for example, of indium, lead, tin, or alloys preferably containing the aforementioned metals.

The heat sink 3 has a generally V-shaped groove 10. As best seen in FIG. 1, a solid mechanical connection between the heat sink 3 and the chip 2 exists only outside of the groove 10, the groove 10 remaining empty.

Figure 2:
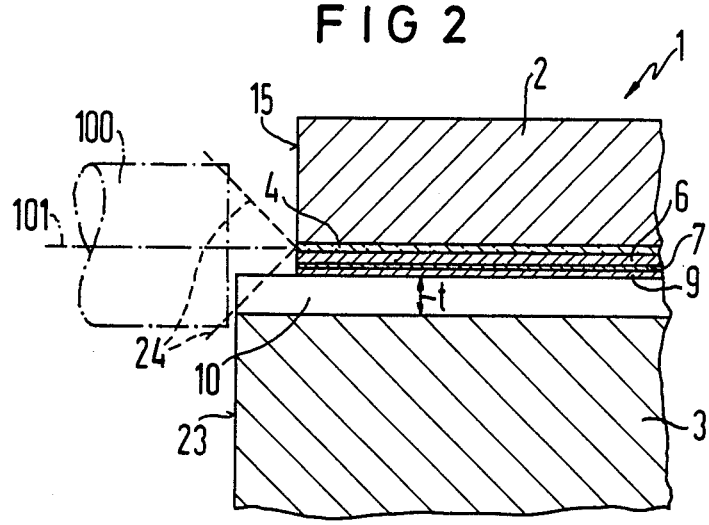
FIG. 2 is a sectional view of the laser diode and heat sink shown in FIG. 1 taken along line II—II.

As best seen in FIG. 2, the chip 2 may be mounted on the surface 13 of the heat sink 3 with its end face 15 set back or recessed relative to the front or leading face 23 of the body of the heat sink. This facilitates adjustment during mounting. For example, the end face 15 may be recessed relative to the front fact 23 by any dimension between 0 and 20 micrometers. Despite some mechanical resilience of the end face 15, and thus of the laser radiation exit face 14 as well, the empty groove 10 enables the laser radiation 24 to emerge unimpeded by the body of the heat sink 3. This occurs despite the emission angle (relative to the normal of the exit face 14), which may be as large as approximately 70°. A portion of the laser radiation 24 occupies the empty volume provided by the groove 10. To this end, the groove 10 has a width b and a depth t.

The width b of the groove 10 is preferably approximately equal to the width of the wave-conducting region of the laser radiation of the zone 4. Given a standard width of 3 to 4 micrometers for the laser-active zone 4, the width of the wave-conducting region is approximately 30 micrometers. It is thus preferable to select the width b of the groove 10 to be in the range of approximately 30 through 100 micrometers. A preferably depth t for the groove 10 assuring unimpeded emission of the laser radiation 24 is approximately 20 through 50 micrometers.

A further advantage is achieved by dimensioning the width b of the groove 10 approximately equal to the width of the wave-conducting region of the laser radiation. As stated above, a solid mechanical connection between the chip 2 and the heat sink 3 exists only outside of the groove 10. This causes mechanical stresses of the chip 2 and the heat sink 3 relative to each other proceeding through this fixed mechanical connection are homogeneously distributed in the region of the laser-active zone 4 of the chip 2, this improving the useful life of the laser diode. To this end, however, the groove 10 must extend along the entire length l of the laser-active zone 4, as shown in the drawings. The heat dissipation from the laser-active zone 4 into the heat sink 3, in comparison to a conventional laser diode having a groove filled with solder, is reduced, however, this reduction is not of major significance and is at any rate not lower than for conventional laser diodes mounted upside-down.

As stated above, the groove 10 is preferably of a V-shape, although other shapes such as a U-shape or a semicircular shape are suitable. The important factor is that the radiation 24 exiting the laser diode is not impeded and that advantageous relieving of mechanical stresses and current and heat dissipation are achieved by appropriate selection of the width b.

The solid angle assumed by the laser radiation 24 emerging from the end face 15 is indicated in FIG. 2. A glass fiber waveguide 100 having a lens-like head is also indicated therein with dashed lines. The radiation 24 enters the glass fiber 100 and is transmitted thereby. A central axis 101 of the waveguide 100 is disposed at the same level as the layer-active zone 4. The spacing of the lens head of the fiber 100 from the face 14 is approximately 20 micrometers, and the fiber 100 is approximately 100 to 200 micrometers in thickness.

Although modifications and changes may be suggested by those skilled in the art it is the intention of the inventor to embody within the patent warranted hereon all changes and modifications as reasonably and properly come within the scope of his contribution to the art.

I claim as my invention:

1. A combination laser diode and heat sink assembly comprising:
    a semiconductor chip in which said laser diode is realized, said semiconductor chip having a strip-shaped laser-active zone, a radiation exit port in an end face of said chip, and at least one contact layer;
    a solder layer disposed between said chip and said heat sink for mechanically connecting said chip and said heat sink, said chip being disposed with said contact layer adjacent said solder layer; and
    said heat sink having an empty groove therein and said chip being mounted on said heat sink with said strip-shaped laser-active zone parallel to said groove such that said radiation exit port is disposed above said groove, said groove having dimentions for permitting laser radiation emitted with divegence angle from said radiation exit port not to impinge on said heat sink even if said end face containing said radiation exit port being recessed from an edge of said heat sink up to 20 micrometers, said solder layer extending only up to the edges of said groove.

2. A laser diode as claimed in claim 1 wherein said groove has a V-shape.

3. A laser diode as claimed in claim 1 wherein said laser-active zone of said chip has a wave-conducting region, and wherein said groove has a width selected approximately equal to the width of said wave-conducting region.

4. A laser diode as claimed in claim 1 wherein said groove has a width selected within the range of approximately 30 through approximately 100 micrometers.

5. A laser diode as claimed in claim 4 wherein said groove has a depth in the range of approximately 20 through approximately 50 micrometers.

* * * * *